(12) United States Patent
Nakamura

(10) Patent No.: US 11,447,871 B2
(45) Date of Patent: Sep. 20, 2022

(54) APPARATUS FOR MANUFACTURING SEMICONDUCTOR DEVICE AND METHOD OF MANUFACTURING SEMICONDUCTOR DEVICE

(71) Applicant: Mitsubishi Electric Corporation, Tokyo (JP)

(72) Inventor: Shotaro Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 361 days.

(21) Appl. No.: 16/406,062

(22) Filed: May 8, 2019

(65) Prior Publication Data
US 2019/0360105 A1   Nov. 28, 2019

(30) Foreign Application Priority Data

May 28, 2018 (JP) .............................. JP2018-101202

(51) Int. Cl.
    *C23C 18/16*     (2006.01)
    *H01L 21/02*     (2006.01)
    (Continued)

(52) U.S. Cl.
CPC ............ *C23C 18/1628* (2013.01); *B05C 3/02* (2013.01); *B05C 11/10* (2013.01);
(Continued)

(58) Field of Classification Search
CPC ....... C23C 18/1628; B05C 3/02; B05C 11/10; C25D 5/08
See application file for complete search history.

(56) References Cited

U.S. PATENT DOCUMENTS 4,183,799 A * 1/1980 Sellitto ................ C25D 7/0614
                                                                         204/206
4,877,493 A * 10/1989 Yamato .................... C25D 7/04
                                                                         205/150
(Continued)

FOREIGN PATENT DOCUMENTS

| DE | 19734485 A1 | 2/1998 |
|----|-------------|--------|
| EP | 0 460 645 A1 | 12/1991 |
| JP | 2014-234539 A | 12/2014 |

OTHER PUBLICATIONS

An Office Action issued by the German Patent Office dated Oct. 6, 2021, which corresponds to German Patent Application No. 10 2019 207 313.1 and is related to U.S. Appl. No. 16/406,062 with English language translation.

*Primary Examiner* — Dah-Wei D. Yuan
*Assistant Examiner* — Stephen A Kitt
(74) *Attorney, Agent, or Firm* — Studebaker & Brackett PC

(57) ABSTRACT

There is provided a technique capable of forming a plating film excellent in film thickness and quality uniformity on a to-be-plated surface of a semiconductor wafer while suppressing an increase in costs of facilities. An apparatus for manufacturing a semiconductor device includes: a reaction bath; a supply pipe provided inside the reaction bath and including a plurality of ejection holes for ejecting the reaction solution, the ejecting holes being arranged in a longitudinal direction of the supply pipe; and an outer bath serving as a reservoir bath provided adjacent to the reaction bath on a first end side of the supply pipe and storing therein the reaction solution overflowed the reaction bath. The aperture ratio of part of the ejection holes more distant from the outer bath is at least partially higher than that of part of the ejection holes closer to the outer bath.

7 Claims, 9 Drawing Sheets

(51) Int. Cl.
  *B05C 11/10* (2006.01)
  *B05C 3/02* (2006.01)
  *H01L 21/67* (2006.01)
  *C25D 5/08* (2006.01)
  *H01L 21/288* (2006.01)
  *C23C 18/18* (2006.01)

(52) U.S. Cl.
  CPC ............ *C23C 18/1862* (2013.01); *C25D 5/08* (2013.01); *H01L 21/02068* (2013.01); *H01L 21/288* (2013.01); *H01L 21/67011* (2013.01)

(56) References Cited

U.S. PATENT DOCUMENTS

| | | | | |
|---|---|---|---|---|
| 5,421,987 A | * | 6/1995 | Tzanavaras | C25D 5/026 |
| | | | | 205/255 |
| 5,850,841 A | * | 12/1998 | Han | H01L 21/67057 |
| | | | | 134/86 |
| 6,086,731 A | * | 7/2000 | Ishigami | C25D 15/00 |
| | | | | 204/224 R |
| 2004/0084318 A1 | * | 5/2004 | Cohen | H01L 21/2885 |
| | | | | 205/98 |
| 2011/0073482 A1 | * | 3/2011 | Kuriyama | C25D 7/123 |
| | | | | 205/148 |

\* cited by examiner

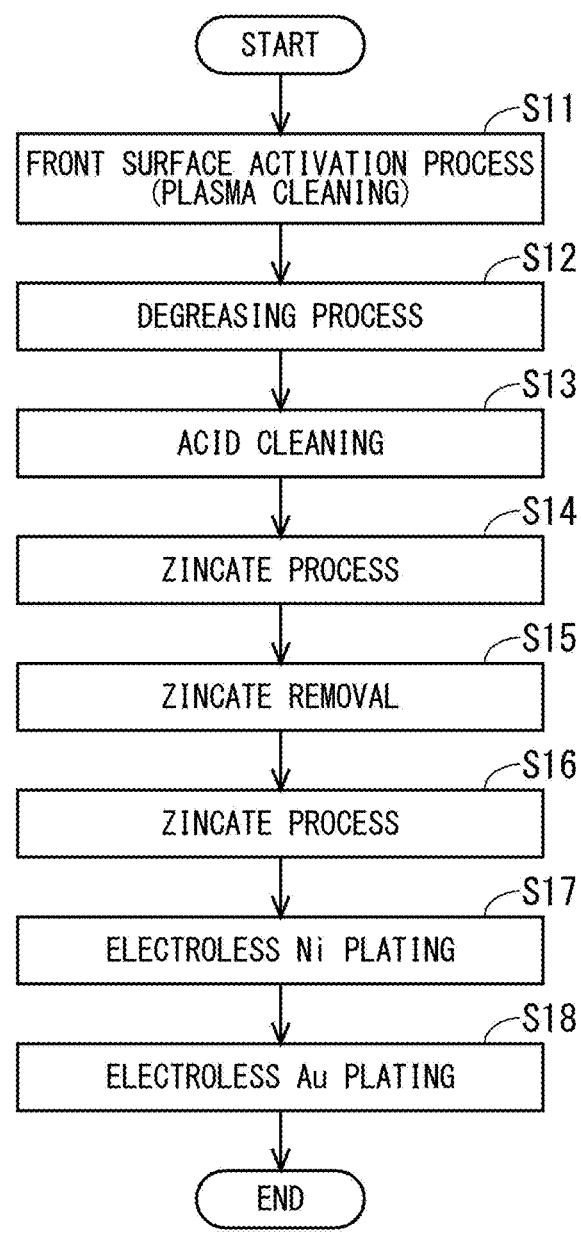
F I G. 5

F I G. 1 0
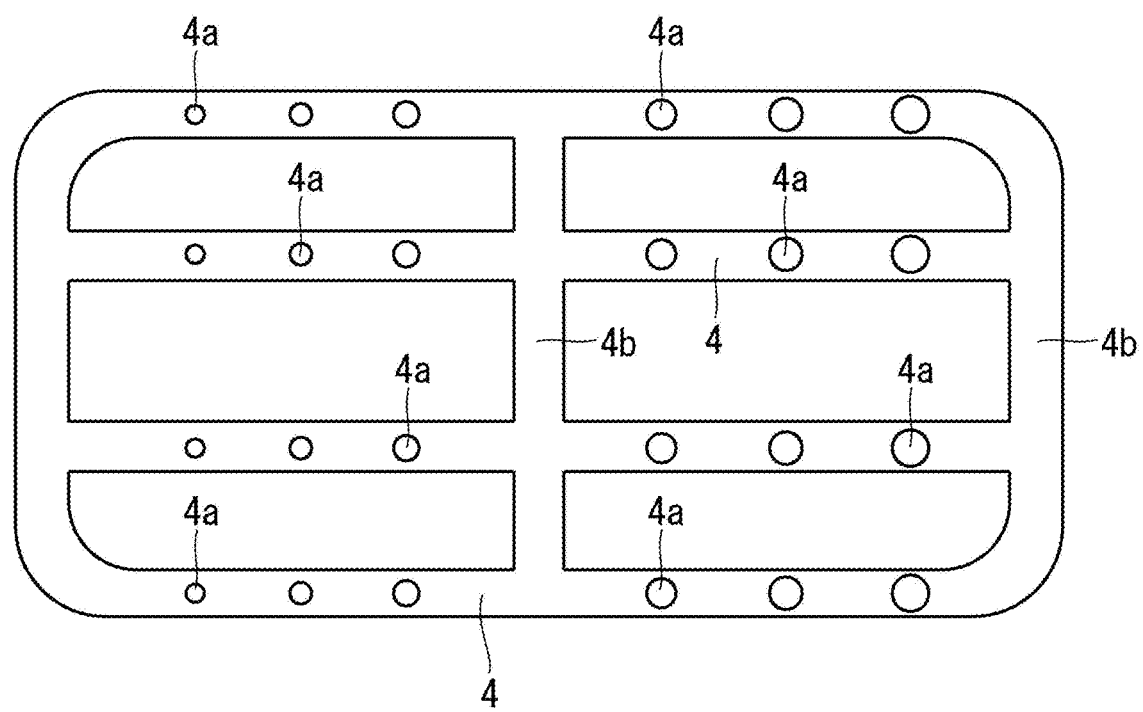

APPARATUS FOR MANUFACTURING SEMICONDUCTOR DEVICE AND METHOD OF MANUFACTURING SEMICONDUCTOR DEVICE

BACKGROUND OF THE INVENTION

Field of the Invention

The present invention relates to a semiconductor device manufacturing apparatus and a semiconductor device manufacturing method which use an electroless plating process to form a plating film excellent in film thickness and quality uniformity on a to-be-plated surface of a semiconductor wafer.

Description of the Background Art

In power semiconductor devices, e.g. power devices such as IGBTs (insulated-gate bipolar transistors) and MOSFETs (metal oxide semiconductor field-effect transistors), the process of making semiconductor substrates thinner has been performed to improve current-carrying performance typified by on-state characteristics and the like. In recent years, semiconductor devices have been manufactured using an ultrathin wafer process that achieves size reduction to approximately 50 µm for the purpose of improving manufacturing costs and characteristics.

For mounting such a front and back conducting type power semiconductor device on a circuit board and the like, electrical connections have been made by soldering the back surface of the power semiconductor device onto the board and by wire bonding the front surface of the power semiconductor device with the use of aluminum wires. In recent years, the trend has been changing to a structure in which the current-carrying performance and heat dissipation performance of a power semiconductor module incorporating power semiconductor devices are improved by soldering both of the front and back surfaces of the power semiconductor devices because the current-carrying performance of the power semiconductor devices has been improved. For this reason, a Ni/Au film excellent in solder bonding has been required for an electrode layer formed on the front surface side of such a power semiconductor device.

Unfortunately, a Ni film, which is eroded to decrease during the solder bonding, is required to be not less than 2 µm. Vacuum deposition methods such as evaporation and sputtering are slow in deposition rate and find difficulties in patterning to cause problems to persist in terms of productivity and manufacturing costs. Thus, attention has been given to Ni formation by means of electroless plating which is capable of high-speed deposition, easy in patterning, and low in costs.

Electroless Ni plating using a technique referred to generally as a zincate process is used for the formation of Ni plating on an Al alloy electrode surface of a semiconductor wafer. The electroless Ni plating using the zincate process is a technique including: performing degreasing and acid pickling on an Al alloy electrode formed on a semiconductor wafer to form the Al alloy electrode into an active surface; depositing a thin Zn film on the Al alloy electrode surface through the use of the fact that Zn is nobler than Al for a standard oxidation-reduction potential; and substituting a Ni film for the Zn film to form the Ni film by a self deposition reaction.

In the aforementioned manufacture, it is a common practice to set semiconductor wafers in a carrier and to immerse the carrier with the semiconductor wafers set therein into baths containing respective chemical solutions, whereby processing proceeds. In particular, in the processing in a Ni plating solution bath, it is necessary that the flow velocity of the solution in the Ni plating solution bath is made uniform for the purpose of ensuring film thickness and quality uniformity. For improvements in film thickness and quality uniformity, structures in the bath have been devised in various ways, such as increasing the capacity of the Ni plating solution bath, providing outer baths on four sides, and devising supply pipes.

However, an attempt to provide the aforementioned structures results in the enormous size of the apparatus and the increase in costs of facilities. A technique for ensuring the film thickness and quality uniformity of plating is disclosed, for example, in Japanese Patent Application Laid-Open No. 2014-234539.

Disclosed in Japanese Patent Application Laid-Open No. 2014-234539 is the technique in which an outer bath has a four-sided structure and the aperture ratio of holes provided in a supply pipe decreases toward a reaction solution supply side and increases toward an air bubble vent portion side. This technique suppresses the generation of air bubble streaks to achieve the deposition of films excellent in film thickness and quality uniformity.

However, in the technique disclosed in Japanese Patent Application Laid-Open No. 2014-234539, it is difficult for a bath including a one-sided outer bath to ensure the film thickness and quality uniformity of plating. Also, this technique necessitates the provision of the air bubble vent portion that is a structure for venting air bubbles for the supply pipe and includes the bath including a four-sided outer bath to give rise to a problem that costs of facilities are increased. Further, the amount of reaction solution supplied to a to-be-plated surface is smaller in the presence of the air bubble vent portion than in the absence of the air bubble vent portion. This reduces a deposition rate to reduce throughput. For an increase in the amount of supplied reaction solution, there arises a need to upsize a pump, whereby the problem of the increase in costs of facilities is considered to result.

SUMMARY

It is therefore an object of the present invention to provide a technique capable of forming a plating film excellent in film thickness and quality uniformity on a to-be-plated surface of a semiconductor wafer while suppressing an increase in costs of facilities.

An apparatus for manufacturing a semiconductor device according to the present invention includes: a reaction bath, at least one supply pipe, and a first reservoir bath. The reaction bath immerses a semiconductor wafer in a reaction solution stored therein to form a plating film on the semiconductor wafer. The at least one supply pipe is provided inside the reaction bath and includes a plurality of ejection holes for ejecting the reaction solution, the ejecting holes being arranged in a longitudinal direction of the supply pipe. The first reservoir bath is provided adjacent to the reaction bath and stores therein the reaction solution overflowed the reaction bath. The aperture ratio of part of the ejection holes more distant from the first reservoir bath is at least partially higher than that of part of the ejection holes closer to the first reservoir bath.

The aperture ratio of part of the ejection holes more distant from the first reservoir bath is at least partially higher than that of part of the ejection holes closer to the first reservoir bath. This provides a uniform solution flow velocity in the reaction bath to form a plating film excellent in film thickness and quality uniformity on the semiconductor wafer. The apparatus is capable of producing these effects with the use of a simple configuration to suppress an increase in costs of facilities.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a flow diagram of a plating process step;

FIG. 10 is a schematic view of another plurality of supply pipes provided in the semiconductor device manufacturing apparatus according to the first modification of the first preferred embodiment;

DESCRIPTION OF THE PREFERRED EMBODIMENTS

First Preferred Embodiment

Figure 1:
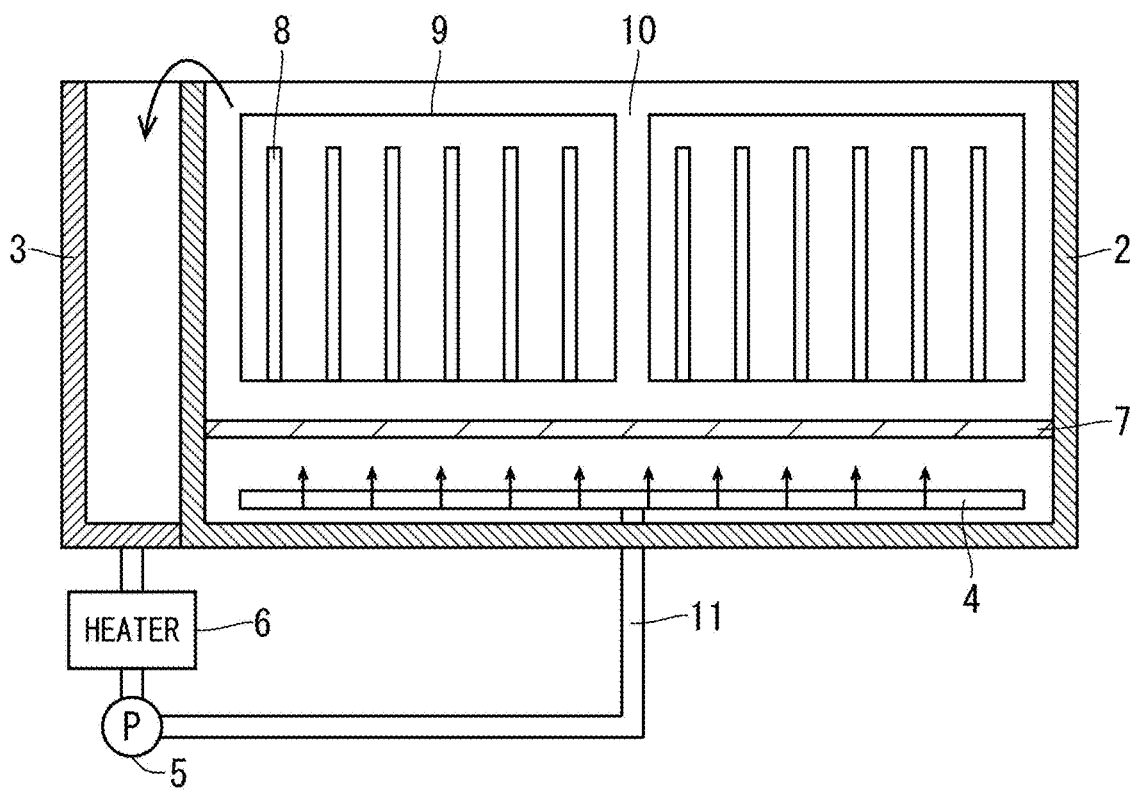
FIG. 1 is a schematic view of a semiconductor device manufacturing apparatus according to a first preferred embodiment of the present invention.
Figure 2:
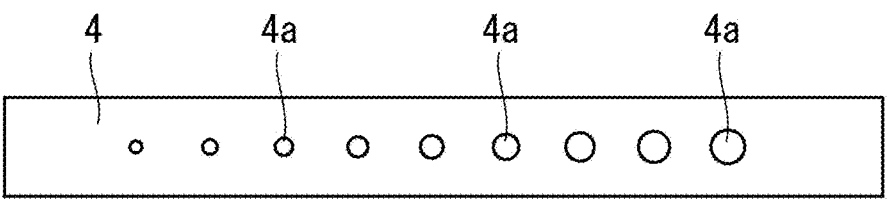
FIG. 2 is a schematic view showing an arrangement of ejection holes in a supply pipe provided in the semiconductor device manufacturing apparatus according to the first preferred embodiment.
Figure 3:
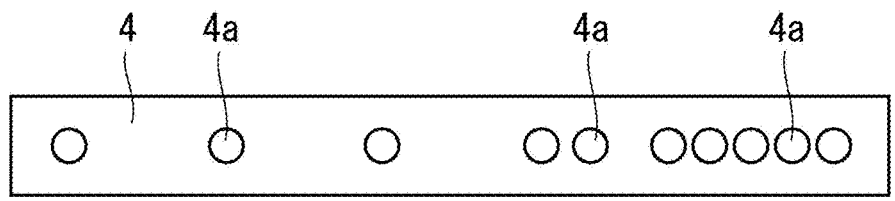
FIG. 3 is a schematic view showing another arrangement of the ejection holes in the supply pipe provided in the semiconductor device manufacturing apparatus according to the first preferred embodiment.

A first preferred embodiment according to the present invention will now be described with reference to the drawings. FIG. 1 is a schematic view of a semiconductor device manufacturing apparatus according to the first preferred embodiment of the present invention, and is a sectional view taken in a direction parallel to the long edges of a reaction bath 2. FIG. 2 is a schematic view showing an arrangement of ejection holes 4a in a supply pipe 4 provided in the semiconductor device manufacturing apparatus. FIG. 3 is a schematic view showing another arrangement of the ejection holes 4a in the supply pipe 4 provided in the semiconductor device manufacturing apparatus.

In general, a chemical solution bath that performs electroless Ni plating includes a four-sided or two-sided reservoir bath. In the first preferred embodiment, the chemical solution bath includes a one-sided reservoir bath. As shown in FIG. 1, a film deposition apparatus 1 that is the semiconductor device manufacturing apparatus is an apparatus for performing an electroless Ni plating process on semiconductor wafers 8 processed by procedures shown in FIGS. 4 and 5 to be described later.

As shown in FIGS. 2 and 3, the supply pipe 4 includes the plurality of ejection holes 4a. The ejection holes 4a are arranged in a longitudinal direction of the supply pipe 4. The aperture ratio of part of the ejection holes 4a more distant from an outer bath 3 is at least partially higher than that of part of the ejection holes 4a closer to the outer bath 3. Thus, a Ni plating film excellent in film thickness and quality uniformity is deposited on an Al alloy film of each semiconductor wafer 8 by an electroless plating process with the use of a simple facility configuration without any reduction in productivity. This produces the effect of suppressing an increase in costs of facilities. It should be noted that the aperture ratio refers to an aperture ratio of the supply pipe 4 per unit length.

Figure 4:
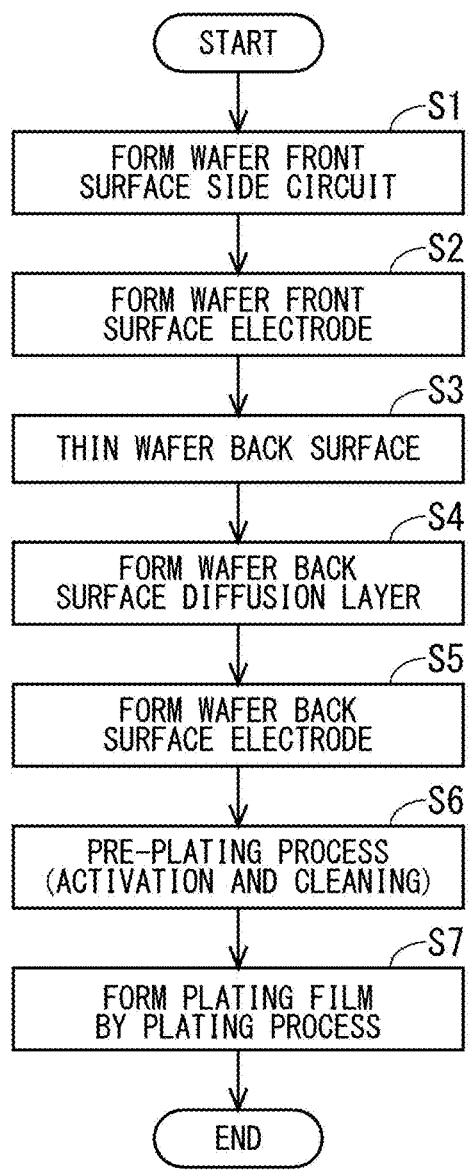
FIG. 4 is a flow diagram of a semiconductor device manufacturing method according to the first preferred embodiment.

Next, a method of manufacturing a semiconductor device will be described. FIG. 4 is a flow diagram of the method of manufacturing a semiconductor device. FIG. 5 is a flow diagram of a plating process step.

As shown in FIG. 4, a wafer front surface side circuit is initially formed (Step S1). In the step of forming the wafer front surface side circuit, a semiconductor element region is formed on the front surface side of each semiconductor wafer 8 made of Si by performing an implantation step, a diffusion step, a photolithography step, an etching step, and a deposition step.

Next, a wafer front surface electrode is formed (Step S2). In the step of forming the wafer front surface electrode, a vacuum evaporation method or a sputtering method, for example, is used to form a front surface electrode made of aluminum, for example, on a desired region of the front surface of each semiconductor wafer 8, the desired region being approximately 5 μm, for example. Examples of the material of the front surface electrode used herein include pure aluminum, AlSi alloys, AlCu alloys, and AlSiCu alloys.

Next, a wafer back surface is thinned (Step S3). In the step of thinning the wafer back surface, the back surface of each semiconductor wafer 8 is thinned to a desired thickness by wet etching including hydrofluoric acid or nitric acid or by machining. Thereafter, a wafer back surface diffusion layer is formed by ion implantation or an activation process using heat treatment (Step S4).

Next, a wafer back surface electrode is formed (Step S5). In the step of forming the wafer back surface electrode, a vacuum evaporation method or a sputtering method as in the step of forming the wafer front surface electrode, for example, is used to form a Ni/Au film excellent in solder bonding. Examples of a metal silicide layer capable of ohmic contact with each semiconductor wafer 8 used herein as the material of the back surface electrode include AlSi alloys, NiSi alloys, and TiSi alloys.

For the formation of a plating film on both of the front and back surfaces of each semiconductor wafer 8, the process steps until the formation of the metal silicide layer are performed. Thereafter, a pre-plating process is performed (Step S6), following which the plating film is formed by a plating process (Step S7).

Next, details on the plating process step will be described. As shown in FIG. 5, an oxygen plasma cleaning process is performed on the electrode surface formed on the front surface in a front surface activation process (Step S11). The oxygen plasma cleaning process is a processing method which cleans the front surface by acid-decomposing organic residues unremovable by the pre-plating process with oxygen plasma or beating out the organic residues.

Subsequently, a degreasing process and acid cleaning are performed (Steps S12 and S13). The degreasing process is performed to remove slight organic contamination remaining on the front surface of the Al alloy and an oxide film. Subsequently, the process of neutralizing the front surface of the Al alloy and etching the front surface of the Al alloy to roughen the front surface, thereby increasing the reactivity of a processing solution in a subsequent step, which in turn enhances the adhesion of plating.

Next, a zincate process is performed (Step S14). The zincate process is the process of forming a coating of zinc (Zn) while removing an aluminum oxide film from the front surface of the Al alloy. Thereafter, the Zn coating is removed by immersion in nitric acid (Step S15), following which the zincate process is performed again (Step S16) to form a Zn coating. In this manner, the zincate process performed twice forms a dense Zn coating on the front surface of the Al alloy to provide a plating film strong in adhesion and excellent in uniformity. The zincate process performed more times makes the front surface of the Al alloy smoother to provide better finished quality of the plating film. However, the zincate process is in general performed approximately three times at the most in consideration of productivity.

Thereafter, electroless Ni plating is performed (Step S17). When the Zn-coated Al alloy film is immersed in an electroless Ni plating solution, Ni is deposited on the Al alloy at first because Zn is less noble than Ni in standard oxidation-reduction potential. Subsequently, after the front surface is coated with Ni, Ni is deposited by reduction under the action of a reducing agent contained in the plating solution. It is desirable that the electroless Ni plating film has a thickness in the range of 2 to 10 μm in consideration of film stresses on each semiconductor wafer 8 and the like.

Finally, after the formation of the electroless Ni plating film, each semiconductor wafer 8 is immersed in an electroless Au plating solution in avoidance of oxidation to form an electroless Au plating film in the range of 20 to 100 nm (Step S18). In this manner, the electroless plating process is capable of easily forming such a film having a thickness on the order of several micrometers, and does not deposit the electroless Ni plating film on the upper surface of a protective film made of polyimide or the like that transfers no electrons. This allows the selective deposition of the electroless Ni plating to facilitate the process, thereby improving productivity.

The film deposition apparatus 1 will be described again. As shown in FIG. 1, the film deposition apparatus 1 includes the reaction bath 2, the outer bath 3 serving as a reservoir bath, the supply pipe 4, a pump 5, a heater 6, a flow straightener 7, carriers 9, and a pipe 11.

The reaction bath 2 is rectangular in shape as seen in plan view. The supply pipe 4, the flow straightener 7, and the carriers 9 are provided inside the reaction bath 2. The carriers 9 are members for setting the semiconductor wafers 8 therein. The semiconductor wafers 8 set in the carriers 9 are placed parallel to or perpendicularly to the supply pipe 4, whereby the Ni plating film is deposited on such a multiplicity of semiconductor wafers 8 at a time. The reaction bath 2 forms a plating film on each of the semiconductor wafers 8 by immersing the semiconductor wafers 8 in a reaction solution 10 stored inside the reaction bath 2. The flow straightener 7 is disposed under the carriers 9.

The outer bath 3 is provided adjacent to the reaction bath 2 on a first end side of the supply pipe 4. More specifically, the outer bath 3 is provided adjacent to one short edge of the rectangular shape of the reaction bath 2, and stores therein the reaction solution overflowed the reaction bath 2. This makes the film deposition apparatus 1 more compact in size.

The pipe 11 is connected between a bottom portion of the reaction bath 2 and a bottom portion of the outer bath 3. The supply pipe 4, the pump 5, and the heater 6 are connected to the pipe 11. Thus, the reaction solution 10 is supplied to the supply pipe 4 and circulated in the reaction bath 2.

The supply pipe 4 extends in a horizontal direction inside the reaction bath 2, and is disposed under the flow straightener 7. More specifically, the supply pipe 4 extends parallel to the long edges of the rectangular shape of the reaction bath 2. In other words, the supply pipe 4 extends away from the outer bath 3.

The supply pipe 4 supplies the reaction solution 10 to the reaction bath 2. The supply pipe 4 is connected to the pipe 11 extending through a central portion of the bottom portion of the reaction bath 2. The reaction solution 10 supplied to a longitudinal mid-portion of the supply pipe 4 diverges into two, i.e. toward and away from the outer bath 3, and then is ejected from the multiple ejection holes 4a formed in the supply pipe 4 to thereby be supplied to the reaction bath 2. The multiple ejection holes 4a are formed in the supply pipe 4, and are oriented upwardly or obliquely upwardly of the reaction bath 2. Although oriented upwardly of the reaction bath 2, the ejection holes 4a may be oriented downwardly, sidewardly, or obliquely downwardly.

This suppresses variations in reaction solution 10 ejected from the ejection holes 4a to provide a uniform flow velocity of the reaction solution 10 supplied to the semiconductor wafers 8. However, the reaction solution 10, which overflows only in one direction, is pulled toward the outer bath 3, whereby the flow velocity of the reaction solution 10 is lower on the side opposed to the outer bath 3.

To prevent this, it is necessary that the aperture ratio of part of the ejection holes 4a more distant from the outer bath 3 is at least partially higher than that of part of the ejection holes 4a closer to the outer bath 3, as shown in FIGS. 2 and 3. The expression "at least partially higher" used herein is meant to encompass an instance in which the aperture ratio of part of the ejection holes 4a more distant from the outer bath 3 is higher than that of part of the ejection holes 4a closer to the outer bath 3 throughout the supply pipe 4 as shown in FIG. 2 and an instance in which the aperture ratio of part of the ejection holes 4a more distant from the outer bath 3 is partially higher than that of part of the ejection holes 4a closer to the outer bath 3 as shown in FIG. 3.

Next, details on the supply pipe 4 will be described. As shown in FIG. 2, the supply pipe 4 includes the multiple ejection holes 4a. The ejection holes 4a are circular in shape, for example, and are arranged in the longitudinal direction of the supply pipe 4. The aperture ratio of part of the ejection holes 4a more distant from the outer bath 3 is higher than that of part of the ejection holes 4a closer to the outer bath 3. In other words, the aperture ratio of the ejection holes 4a increases as the distance from the outer bath 3 increases. In FIG. 2, the left-hand side is the part closer to the outer bath 3, and the right-hand side is the part more distant from the outer bath 3.

The aperture ratio refers to an aperture ratio per unit length, and may be changed by changing the diameter (i.e., the area) of the ejection holes 4a, the density thereof, the spacing therebetween, the number of ejection holes 4a, or the shape thereof. With reference to FIG. 2, the aperture ratio is changed by changing the diameter of the ejection holes 4a. With reference to FIG. 3, the aperture ratio is changed by changing the density of the ejection holes 4a. More specifically, with reference to FIG. 2, the diameter of the ejection holes 4a increases as the distance from the outer bath 3 increases. With reference to FIG. 3, the density of part of the ejection holes 4a more distant from the outer bath 3 is partially higher than that of part of the ejection holes 4a closer to the outer bath 3.

The diameter of part of the ejection holes 4a more distant from the outer bath 3 may be partially greater than that of part of the ejection holes 4a closer to the outer bath 3, rather than throughout the supply pipe 4, with reference to FIG. 2. The density of part of the ejection holes 4a more distant from the outer bath 3 may be higher than that of part of the ejection holes 4a closer to the outer bath 3 throughout the supply pipe 4, rather than partially.

This provides a uniform flow velocity of the reaction solution 10 passing around the semiconductor wafers 8 in the reaction bath 2 to provide the plating film excellent in film thickness and quality uniformity.

By adjusting the aperture ratio of the ejection holes 4a, the Ni plating film excellent in film thickness and quality uniformity is deposited on the Al alloy film of each semiconductor wafer 8 by the electroless plating process with the use of the simple facility configuration without any reduction in productivity. This produces the effect of suppressing an increase in costs of facilities.

Figure 6:
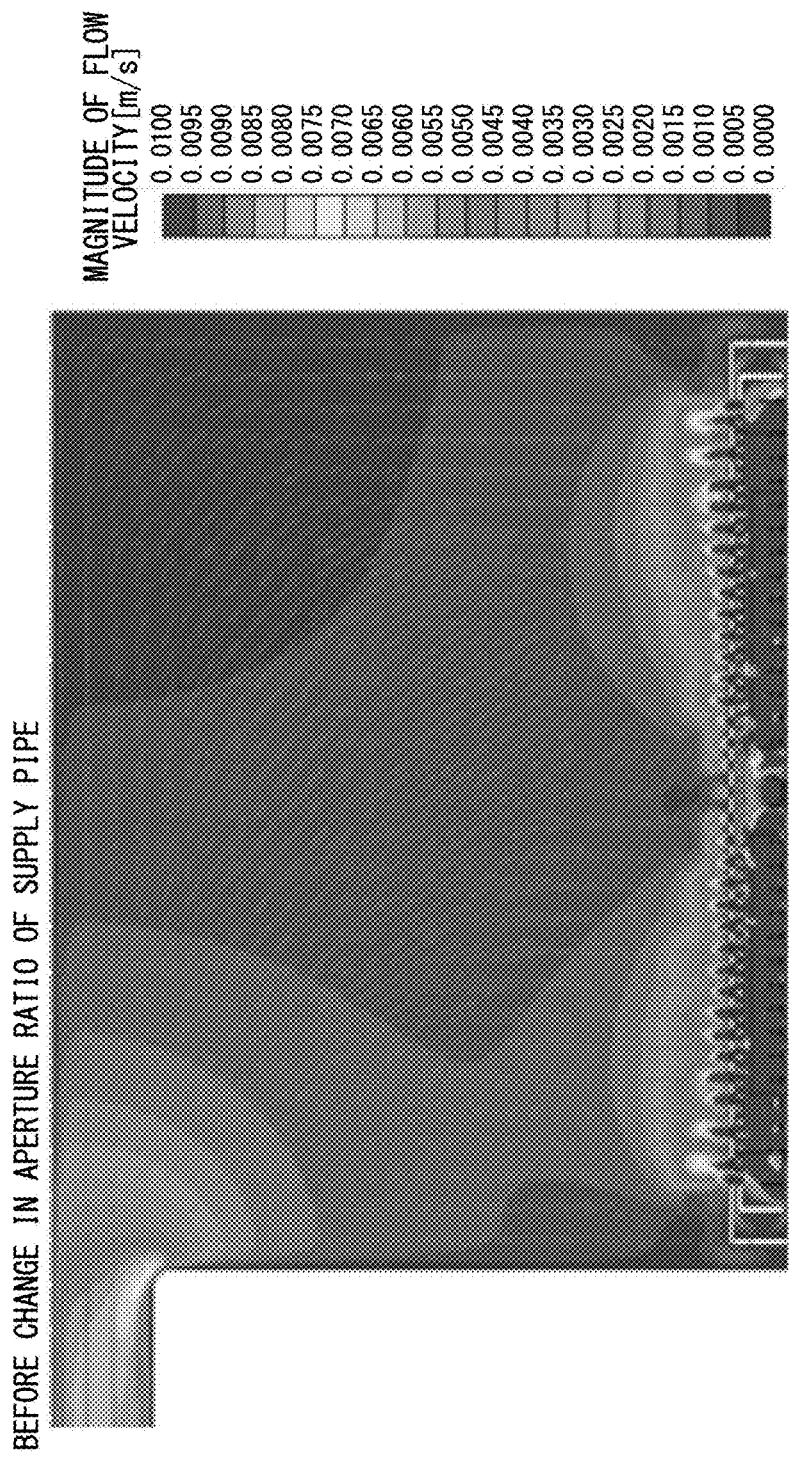
FIG. 6 shows a result of simulation of the magnitude of a flow velocity before a change in aperture ratio of the supply pipe.
Figure 7:
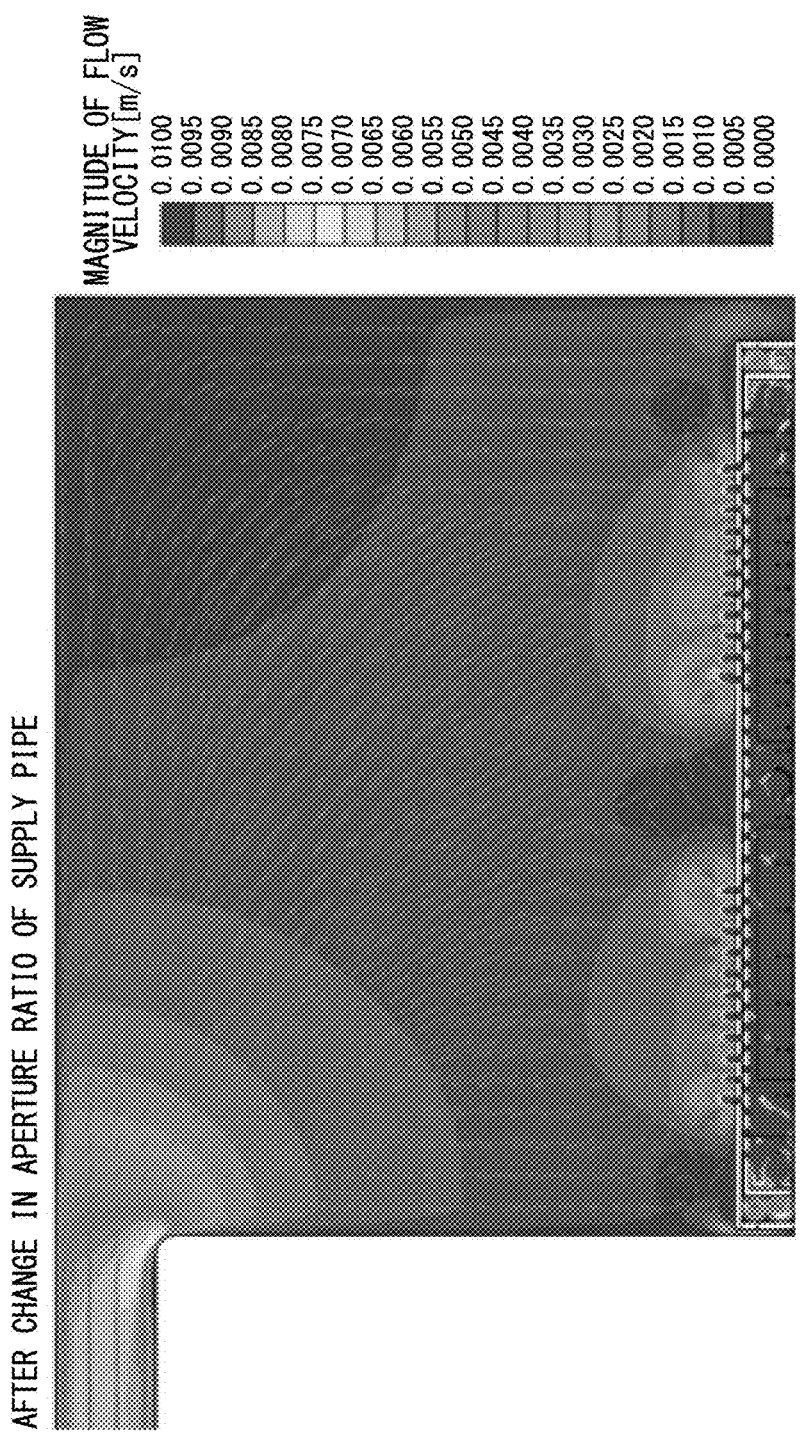
FIG. 7 shows a result of simulation of the magnitude of the flow velocity after the change in aperture ratio of the supply pipe.
Figure 8:
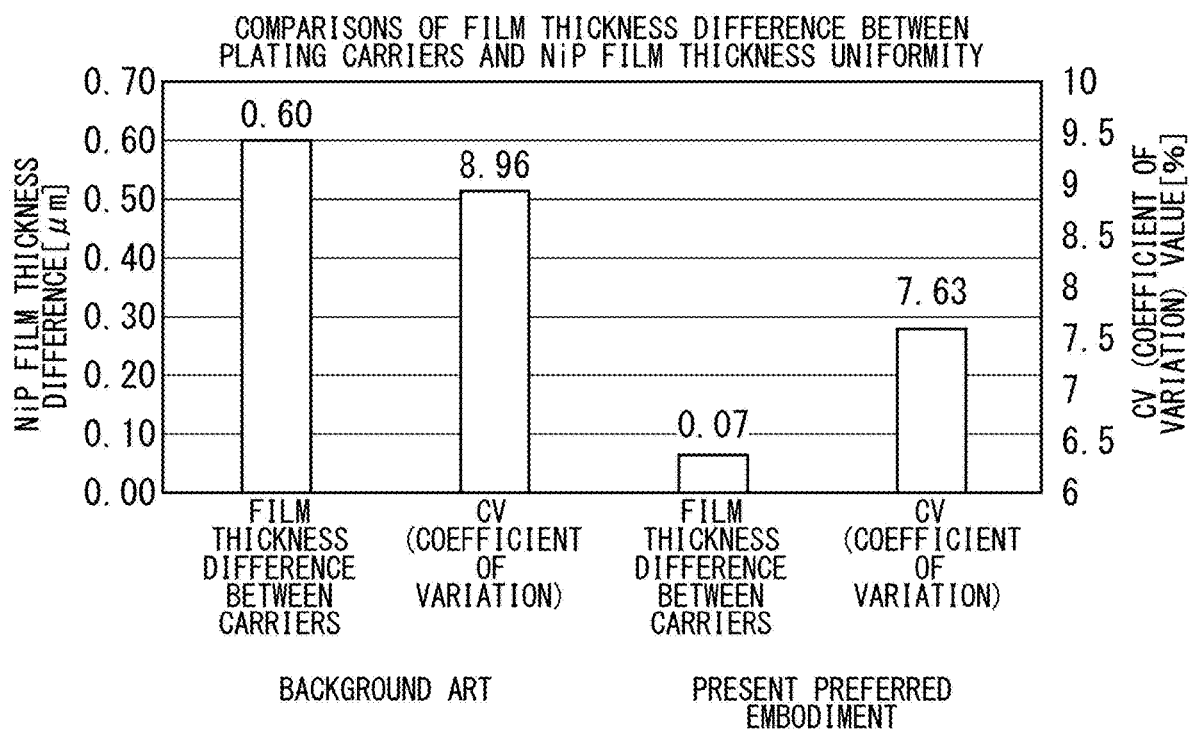
FIG. 8 is a graph showing comparisons of film thickness difference between plating carriers and NiP film thickness uniformity.

Simulation results obtained when the aperture ratio of the ejection holes 4a is actually changed are shown in FIGS. 6 and 7. FIG. 6 shows a result of simulation of the magnitude of the flow velocity before a change in aperture ratio of the supply pipe 4. FIG. 7 shows a result of simulation of the magnitude of the flow velocity after the change in aperture ratio of the supply pipe 4. FIG. 8 is a graph showing comparisons of film thickness difference between plating carriers and NiP film thickness uniformity.

The results of the electroless Ni plating process performed on the semiconductor wafers 8 are as follows. Before the change in aperture ratio of the ejection holes 4a, the in-plane uniformity of the Ni plating film is CV (coefficient of variation)=8.96% and the film thickness difference between plating carriers is 0.60 μm, as shown in FIG. 8. After the change in aperture ratio of the ejection holes 4a, on the other hand, the in-plane uniformity of the Ni plating film is CV=7.63% and the film thickness difference between plating carriers is 0.07 μm, which shows good results.

As described hereinabove, the semiconductor device manufacturing apparatus according to the first preferred embodiment, in which the aperture ratio of part of the ejection holes 4a more distant from the outer bath 3 is at least partially higher than that of part of the ejection holes 4a closer to the outer bath 3, provides a uniform solution flow velocity in the reaction bath 2 to form the plating film excellent in film thickness and quality uniformity on each of the semiconductor wafers 8. The semiconductor device manufacturing apparatus according to the first preferred embodiment is capable of producing such effects with the use of the simple configuration to suppress an increase in costs of facilities.

The diameter of part of the ejection holes 4a more distant from the outer bath 3 is at least partially greater than that of part of the ejection holes 4a closer to the outer bath 3, or the density of part of the ejection holes 4a more distant from the outer bath 3 is at least partially higher than that of part of the ejection holes 4a closer to the outer bath 3. This improves the design flexibility of the film deposition apparatus 1 to achieve the manufacture of the film deposition apparatus 1 more easily.

The reaction bath 2 is rectangular in shape as seen in plan view. The outer bath 3 is provided adjacent to one short edge of the rectangular shape of the reaction bath 2. The supply pipe 4 extends parallel to the long edges of the rectangular shape of the reaction bath 2. This enables only the single supply pipe 4 to supply the reaction solution 10 to the entire reaction bath 2. In this manner, the reduction in the number of supply pipes 4 achieves the manufacture of the film deposition apparatus 1 more easily. The method of manufacturing a semiconductor device includes the step (a) of cleaning a to-be-plated surface of a semiconductor wafer 8, and the step (b) of supplying the reaction solution 10 to the to-be-plated surface of the semiconductor wafer 8 to form a plating film thereon in the film deposition apparatus 1.

Thus, this method cleans organic residues adhering to the to-be-plated surface and ensures the wettability of the plating solution to thereby form the plating film excellent in film thickness and quality uniformity. Also, this method adjusts the aperture ratio of the ejection holes 4a to control the amount of reaction solution 10 supplied from the ejection holes 4a of the supply pipe 4, thereby providing a uniform flow velocity over the entire to-be-plated surface.

The step (a) is the step of performing a plasma cleaning process. The plasma used in the plasma cleaning process is oxygen plasma or argon plasma. The use of the plasma having oxidizing power or etching power achieves the efficient removal of contaminants adhering to the to-be-plated surface.

The step (b) is the step of using the electroless plating process. Thus, the electroless plating is performed with the use of the simple facility configuration while productivity is maintained.

Modifications of First Preferred Embodiment

Figure 9:
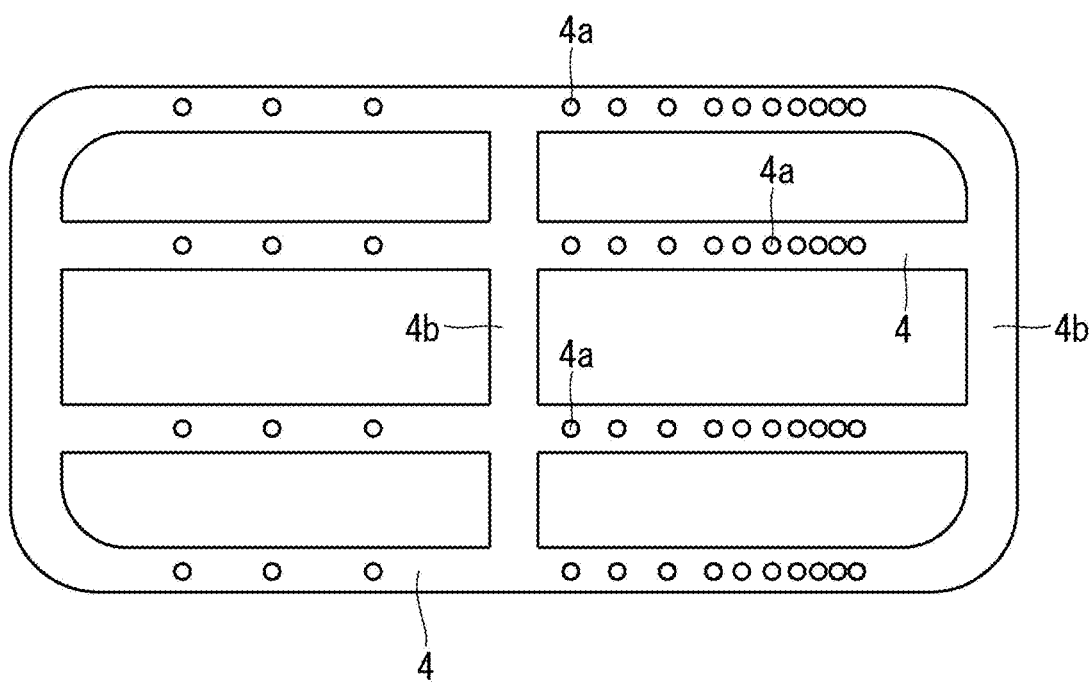
FIG. 9 is a schematic view of a plurality of supply pipes provided in the semiconductor device manufacturing apparatus according to a first modification of the first preferred embodiment.

Next, a first modification of the first preferred embodiment will be described. FIG. 9 is a schematic view of a plurality of supply pipes 4 provided in the semiconductor device manufacturing apparatus according to the first modification of the first preferred embodiment. FIG. 10 is a schematic view of another plurality of supply pipes 4 provided in the semiconductor device manufacturing apparatus according to the first modification of the first preferred embodiment.

As shown in FIG. 9, four supply pipes 4 extend parallel to the long edges of the rectangular shape of the reaction bath 2, and are arranged in a direction parallel to the short edges of the rectangular shape of the reaction bath 2 that is a direction intersecting the longitudinal direction of the supply pipes 4. The four supply pipes 4 are connected to each other with three ducts 4b intersecting the longitudinal direction of the supply pipes 4. The number of ducts 4b is not limited to three. For example, only a middle duct 4b may be provided.

The aperture ratio of part of the ejection holes 4a provided in the four supply pipes 4 which are more distant from the outer bath 3 is at least partially higher than that of part of the ejection holes 4a provided in the four supply pipes 4 which are closer to the outer bath 3.

More specifically, in the right-hand parts of the four supply pipes 4, the aperture ratio of part of the ejection holes 4a more distant from the outer bath 3 is higher than that of part of the ejection holes 4a closer to the outer bath 3. That is, the ejection holes 4a have the same diameter, and part of the ejection holes 4a more distant from the outer bath 3 are spaced a smaller distance apart from each other so as to have a higher density. Part of the ejection holes 4a closer to the outer bath 3 are spaced a greater distance apart from each other than part of the ejection holes 4a more distant from the outer bath 3 so as to have a lower density.

In the left-hand parts of the four supply pipes 4, the ejection holes 4a are spaced equally at a greater distance than in the right-hand parts of the four supply pipes 4 so as to have a lower density. That is, the ejection holes 4a has a constant density when only the left-hand parts of the four supply pipes 4 are viewed. In the left-hand parts of the four supply pipes 4, part the ejection holes 4a closer to the outer bath 3 may also be spaced a greater distance apart from each other than part of the ejection holes 4a more distant from the outer bath 3 so as to have a lower density.

This supplies the reaction solution 10 in greater amounts than does the single supply pipe 4 to the entire reaction bath 2.

Alternatively, as shown in FIG. 10, the diameter of the ejection holes 4a may increase as the distance from the outer bath 3 increases. In this case, effects similar to those in FIG. 9 are produced. The diameter of part of the ejection holes 4a more distant from the outer bath 3 may be partially greater than that of part of the ejection holes 4a closer to the outer bath 3, rather than throughout the supply pipes 4.

As described hereinabove, the supply pipes 4 are arranged in the direction intersecting the longitudinal direction of the supply pipes 4 in the semiconductor device manufacturing apparatus according to the first modification of the first preferred embodiment.

Thus, the first modification of the first preferred embodiment provides a uniform solution flow velocity in the reaction bath 2 to form the plating film excellent in film thickness and quality uniformity on each of the semiconductor wafers 8. The first modification of the first preferred embodiment is capable of producing these effects with the use of the simple configuration to suppress an increase in costs of facilities. Further, all of the supply pipes 4 in which the ejection holes 4a are provided may have the same specs. This facilitates the design and manufacture of the deposition apparatus.

Figure 11:
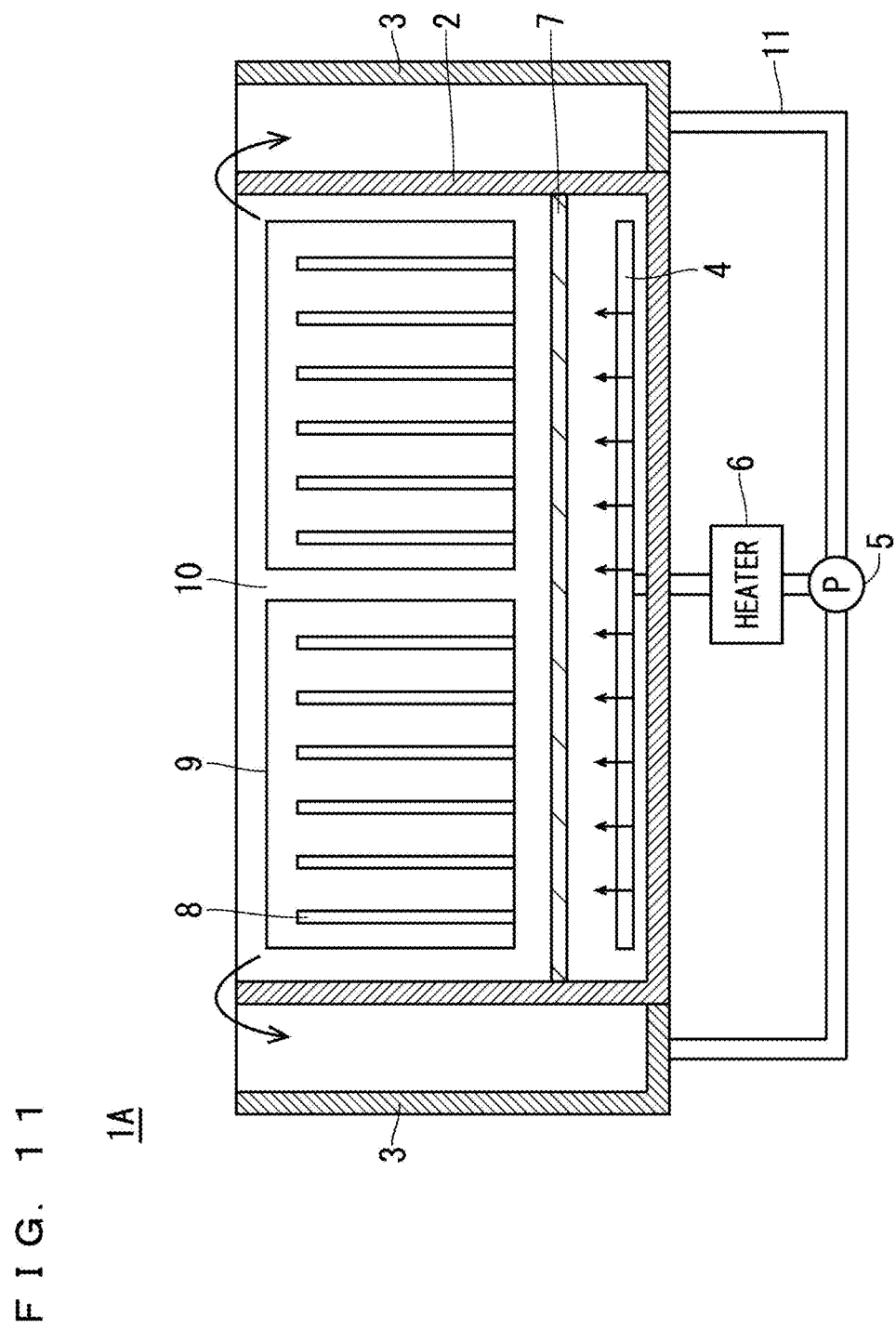
FIG. 11 is a schematic view of the semiconductor device manufacturing apparatus according to a second modification of the first preferred embodiment.
Figure 12:
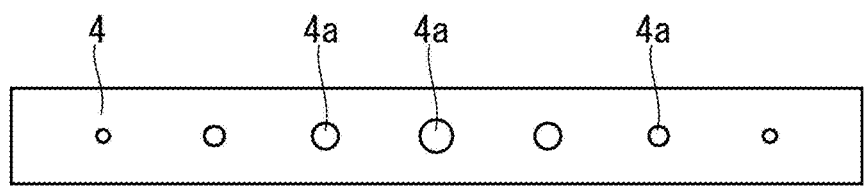
FIG. 12 is a schematic view showing an arrangement of the ejection holes in the supply pipe provided in the semiconductor device manufacturing apparatus according to the second modification of the first preferred embodiment.

Next, a second modification of the first preferred embodiment will be described. FIG. 11 is a schematic view of a film deposition apparatus 1A which is the semiconductor device manufacturing apparatus according to the second modification of the first preferred embodiment, and is a sectional view taken in a direction parallel to the long edges of the reaction bath 2. FIG. 12 is a schematic view showing an arrangement of the ejection holes 4a in the supply pipe 4 provided in the film deposition apparatus 1A according to the second modification of the first preferred embodiment.

As shown in FIG. 11, the film deposition apparatus 1A includes the reaction bath 2, two outer baths 3, the supply pipe 4, the pump 5, the heater 6, the flow straightener 7, the carriers 9, and the pipe 11.

The two outer baths 3 are provided adjacent to the reaction bath 2 on first and second end sides of the supply pipe 4. More specifically, the two outer baths 3 are provided adjacent to the two respective short edges of the rectangular shape of the reaction bath 2. With reference to FIG. 11, the right-hand one of the outer baths 3 corresponds to a second reservoir bath.

As shown in FIG. 12, the aperture ratio of part of the ejection holes 4a more distant from the left-hand one of the outer baths 3 is at least partially higher than that of part of the ejection holes 4a closer to the left-hand outer bath 3. Likewise, the aperture ratio of part of the ejection holes 4a more distant from the right-hand outer bath 3 is at least partially higher than that of part of the ejection holes 4a closer to the right-hand outer bath 3. More specifically, in the right-hand part of the supply pipe 4, the diameter of the ejection holes 4a increases as the distance from the right-hand outer bath 3 increases. In the left-hand part of the supply pipe 4, the diameter of the ejection holes 4a increases as the distance from the left-hand outer bath 3 increases.

Alternatively, in the right-hand part of the supply pipe 4, the density of the ejection holes 4a may be increased as the distance from the right-hand outer bath 3 increases; and in the left-hand part of the supply pipe 4, the density of the ejection holes 4a may be increased as the distance from the left-hand outer bath 3 increases.

The film deposition apparatus 1A may include three or four outer baths 3. In this case, the film deposition apparatus 1A includes two supply pipes 4 each shown in FIG. 12, and the two supply pipe 4 are arranged, for example, so as to intersect each other in a vertical direction. This causes the aperture ratio of part of the ejection holes 4a more distant from the outer baths 3 to be at least partially higher than that of part of the ejection holes 4a closer to the outer baths 3.

As described hereinabove, the semiconductor device manufacturing apparatus according to the second modification of the first preferred embodiment includes the right-hand outer bath 3 in addition to the left-hand outer bath 3 as seen in FIG. 11. The left-hand outer bath 3 is provided on the first end side of the supply pipe 4, and the right-hand outer bath 3 is provided on the second end side of the supply pipe 4. The aperture ratio of part of the ejection holes 4a more distant from the right-hand outer bath 3 is at least partially higher than that of part of the ejection holes 4a closer to the right-hand outer bath 3. This provides a uniform solution flow velocity in the reaction bath 2 to form the plating film excellent in film thickness and quality uniformity on each of the semiconductor wafers 8. The second modification of the first preferred embodiment is capable of producing these effects with the use of the simple configuration to suppress an increase in costs of facilities.

Second Preferred Embodiment

Figure 13:
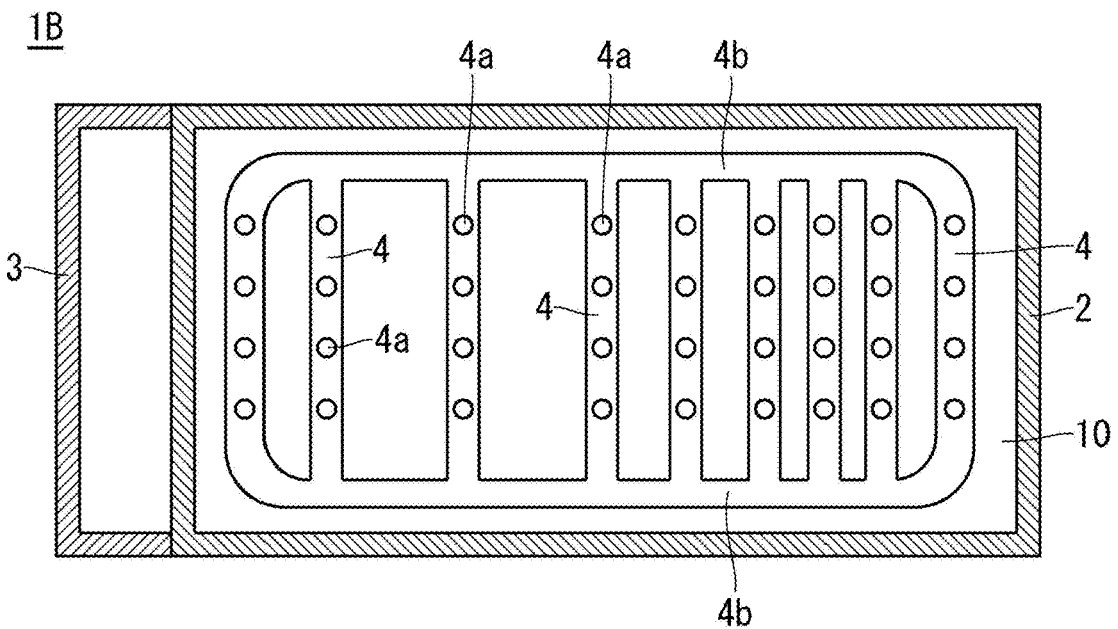
FIG. 13 is a schematic view showing a relationship between a plurality of supply pipes and an outer bath provided in the semiconductor device manufacturing apparatus according to a second preferred embodiment of the present invention.
Figure 14:
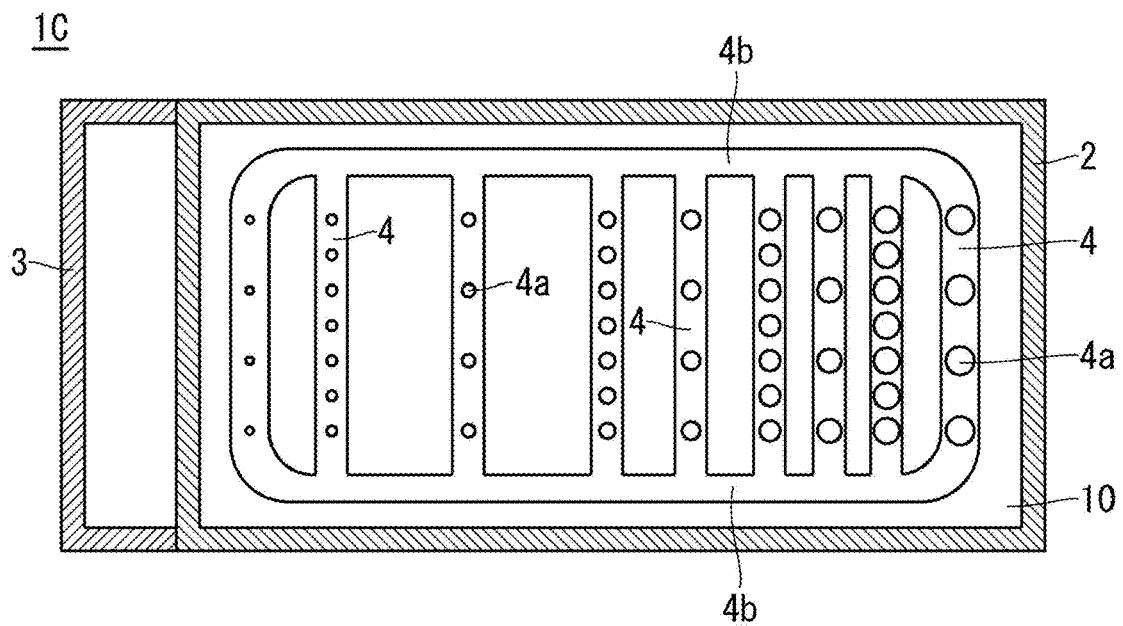
FIG. 14 is a schematic view showing a relationship between another plurality of supply pipes and the outer bath provided in the semiconductor device manufacturing apparatus according to the second preferred embodiment.

Next, the semiconductor device manufacturing apparatus according to a second preferred embodiment will be described. FIG. 13 is a schematic view showing a relationship between a plurality of supply pipes 4 and the outer bath 3 provided in a film deposition apparatus 1B which is the semiconductor device manufacturing apparatus according to the second preferred embodiment, and is a sectional view taken in a horizontal direction between the supply pipes 4 and the flow straightener 7. FIG. 14 is a schematic view showing a relationship between another plurality of supply pipes 4 and the outer bath 3 provided in a film deposition apparatus 1C according to the second preferred embodiment, and is a sectional view taken in a horizontal direction between the supply pipes 4 and the flow straightener 7. In the second preferred embodiment, components similar to those of the first preferred embodiment are designated by the same reference numerals and characters, and will not be described.

As shown in FIG. 13, the second preferred embodiment differs from the first modification of the first preferred embodiment in direction in which the supply pipes 4 are arranged.

The outer bath 3 is provided adjacent to the reaction bath 2 as seen in a direction perpendicular to the longitudinal direction of nine supply pipes 4. More specifically, the outer bath 3 is provided adjacent to one short edge of the rectangular reaction bath 2. The nine supply pipes 4 extend parallel to the short edges of the rectangular shape of the reaction bath 2, and are arranged in a direction parallel to the long edges of the rectangular shape of the reaction bath 2 that is a direction intersecting the longitudinal direction of the supply pipes 4. That is, the nine supply pipes 4 are arranged away from the outer bath 3 and in a direction intersecting the longitudinal direction of the supply pipes 4. The nine supply pipes 4 are connected to each other with two ducts 4b intersecting the longitudinal direction of the supply pipes 4.

The aperture ratio of part of the ejection holes 4a more distant from the outer bath 3 is at least partially higher than that of part of the ejection holes 4a closer to the outer bath 3. More specifically, the ejection holes 4a have the same diameter, and the number of supply pipes 4 in the right-hand part of the reaction bath 2 is greater than that in the left-hand part thereof. In other words, the supply pipes 4 are arranged at shorter intervals in the right-hand part of the reaction bath 2 than in the left-hand side part, and include accordingly a greater number of ejection holes 4a in the right-hand part of the reaction bath 2 than in the left-hand part thereof. Thus, all of the supply pipes 4 in which the ejection holes 4a are provided may have the same specs. This facilitates the design and manufacture of the film deposition apparatus 1B. With reference to FIG. 13, the density of part of the ejection holes 4a more distant from the outer bath 3 is partially higher than that of part of the ejection holes 4a closer to the outer bath 3. However, the density of part of the ejection holes 4a more distant from the outer bath 3 may be higher than that of part of the ejection holes 4a closer to the outer bath 3 throughout the supply pipes 4, rather than partially.

Alternatively, the diameter of the ejection holes 4a in the nine supply pipes 4 may increase as the distance from the outer bath 3 increases, as shown in FIG. 14. Specifically, the diameter of the ejection holes 4a is changed from one supply pipe 4 to another while the supply pipes 4 include the same number of ejection holes 4a, or the number of ejection holes 4a is changed from one supply pipe 4 to another while the supply pipes 4 include the ejection holes 4a having the same diameter. Otherwise, these may be combined, whereby the aperture ratio may be adjusted. This improves the design flexibility of the film deposition apparatus 1C to achieve the manufacture of the film deposition apparatus 1C more easily. With reference to FIG. 14, the supply pipes 4 are arranged at shorter intervals in the right-hand part of the reaction bath 2 than in the left-hand part thereof. However, all of the supply pipes 4 may be arranged at equal intervals. With reference to FIG. 14, the diameter of part of the ejection holes 4a more distant from the outer bath 3 is greater than that of part of the ejection holes 4a closer to the outer bath 3 throughout the supply pipes 4. However, the diameter of part of the ejection holes 4a more distant from the outer bath 3 may be partially greater than that of part of the ejection holes 4a closer to the outer bath 3, rather than throughout the supply pipes 4.

As described hereinabove, the supply pipes 4 are arranged away from the outer bath 3 and in a direction intersecting the longitudinal direction of the supply pipes 4 in the semiconductor device manufacturing apparatus according to the second preferred embodiment.

This provides a uniform flow velocity in the reaction bath 2 to provide the plating film excellent in film thickness and quality uniformity on each of the semiconductor wafers 8. The semiconductor device manufacturing apparatus according to the second preferred embodiment is capable of producing these effects with the use of the simple configuration to suppress an increase in costs of facilities.

The outer bath 3 may be provided adjacent to one long edge of the rectangular shape of the reaction bath 2. In this case, the supply pipes 4 extend parallel to the long edges of the rectangular shape of the reaction bath 2. This provides a greater number of supply pipes 4 than in the first preferred embodiment to improve the design flexibility for the provision of the supply pipes 4, thereby achieving the manufacture of the film deposition apparatus 1 more easily.

In the film deposition apparatus 1B as shown in FIG. 13, all of the supply pipes 4 in which the ejection holes 4a are provided may have the same specs. This facilitates the design and manufacture of the film deposition apparatus 1B.

In the film deposition apparatus 1C as shown in FIG. 14, the diameter of the ejection holes 4a is changed from one supply pipe 4 to another while the supply pipes 4 include the same number of ejection holes 4a; the number of ejection holes 4a is changed from one supply pipe 4 to another while the supply pipes 4 include the ejection holes 4a having the same diameter; or these are combined, whereby the aperture ratio may be adjusted. This improves the design flexibility of the film deposition apparatus 1C to achieve the manufacture of the film deposition apparatus 1C more easily.

The preferred embodiments according to the present invention may be freely combined within the scope of the invention or the preferred embodiments may be changed and dispensed with, as appropriate.

While the invention has been described in detail, the foregoing description is in all aspects illustrative and not restrictive. It is understood that numerous other modifications and variations can be devised without departing from the scope of the invention.

What is claimed is:

1. An apparatus for manufacturing a semiconductor device, comprising:
   a reaction bath for immersing a semiconductor wafer in a reaction solution stored therein to form a plating film on the semiconductor wafer;
   at least one supply pipe provided inside the reaction bath and including a plurality of ejection holes for ejecting the reaction solution, the ejecting holes being arranged in a longitudinal direction of the supply pipe;
   a first reservoir bath provided adjacent to the reaction bath and storing therein the reaction solution overflowed from the reaction bath, wherein the supply pipe extends away from the first reservoir bath;
   a second reservoir bath different from the first reservoir bath, wherein:
   the first reservoir bath is provided on a first end side of the supply pipe;

the second reservoir bath is provided on a second end side of the supply pipe; and a pipe that connects the first reservoir bath and the reaction bath to allow transport of the reaction solution from the first reservoir bath to the reaction bath, the pipe being in direct contact with a longitudinal midportion of the supply pipe in the reaction bath, wherein in a portion of the supply pipe that includes the ejection holes, the aperture ratio of the ejection holes in a volume of the pipe more distant from the first reservoir bath and the second reservoir bath is higher than that of the ejection holes in a same size volume of the pipe closer to the first reservoir bath and the second reservoir bath.

2. The apparatus according to claim 1, wherein
the at least one supply pipe includes a plurality of supply pipes, and
the supply pipes are arranged in a direction intersecting a longitudinal direction of the supply pipes.

3. The apparatus according to claim 1, wherein
the at least one supply pipe includes a plurality of supply pipes, and
the supply pipes are arranged away from the first reservoir bath and in a direction intersecting a longitudinal direction of the supply pipes.

4. The apparatus according to claim 1, wherein
the diameter of the ejection holes in a volume of the pipe more distant from the first reservoir bath is greater than that of the ejection holes in a same size volume of the pipe closer to the first reservoir bath or the density of the ejection holes in a volume of the pipe more distant from the first reservoir bath is higher than that of the ejection holes in a same size volume of the pipe closer to the first reservoir bath.

5. The apparatus according to claim 1, wherein:
the reaction bath is rectangular in shape as seen in plan view;
the first reservoir bath is provided adjacent to one short edge of the rectangular shape of the reaction bath; and
the supply pipe extends parallel to the long edges of the rectangular shape of the reaction bath.

6. The apparatus according to claim 3, wherein:
the reaction bath is rectangular in shape as seen in plan view;
the first reservoir bath is provided adjacent to one long edge of the rectangular shape of the reaction bath; and
the supply pipes extend parallel to the long edges of the rectangular shape of the reaction bath.

7. An apparatus for manufacturing a semiconductor device, comprising:
a reaction bath for immersing a semiconductor wafer in a reaction solution stored therein to form a plating film on the semiconductor wafer;
at least one supply pipe provided inside the reaction bath and including a plurality of ejection holes for ejecting the reaction solution, the ejecting holes being arranged in a longitudinal direction of the supply pipe; and
a first reservoir bath provided adjacent to the reaction bath and storing therein the reaction solution overflowed from the reaction bath, wherein the supply pipe extends away from the first reservoir bath;
a second reservoir bath different from the first reservoir bath, wherein:
the first reservoir bath is provided on a first end side of the supply pipe;
the second reservoir bath is provided on a second end side of the supply pipe; and
wherein in a portion of the supply pipe that includes the ejection holes, the aperture ratio of the ejection holes in a volume of the pipe in a center of the pipe more distant from the first reservoir bath and the second reservoir bath is higher than that of the ejection holes in a same size volume of the pipe at both ends of the pipe closer to the first reservoir bath and the second reservoir bath.

* * * * *